May 11, 1965 P. BAUER 3,182,676

BINARY COUNTER

Filed April 23, 1962

INVENTOR.
PETER BAUER

BY Griffin and Stokes
ATTORNEYS

United States Patent Office 3,182,676
Patented May 11, 1965

3,182,676
BINARY COUNTER
Peter Bauer, Ambler, Pa., assignor to Sperry Rand Corporation, New York, N.Y., a corporation of Delaware
Filed Apr. 23, 1962, Ser. No. 189,597
8 Claims. (Cl. 137—81.5)

Figures 1, 2:
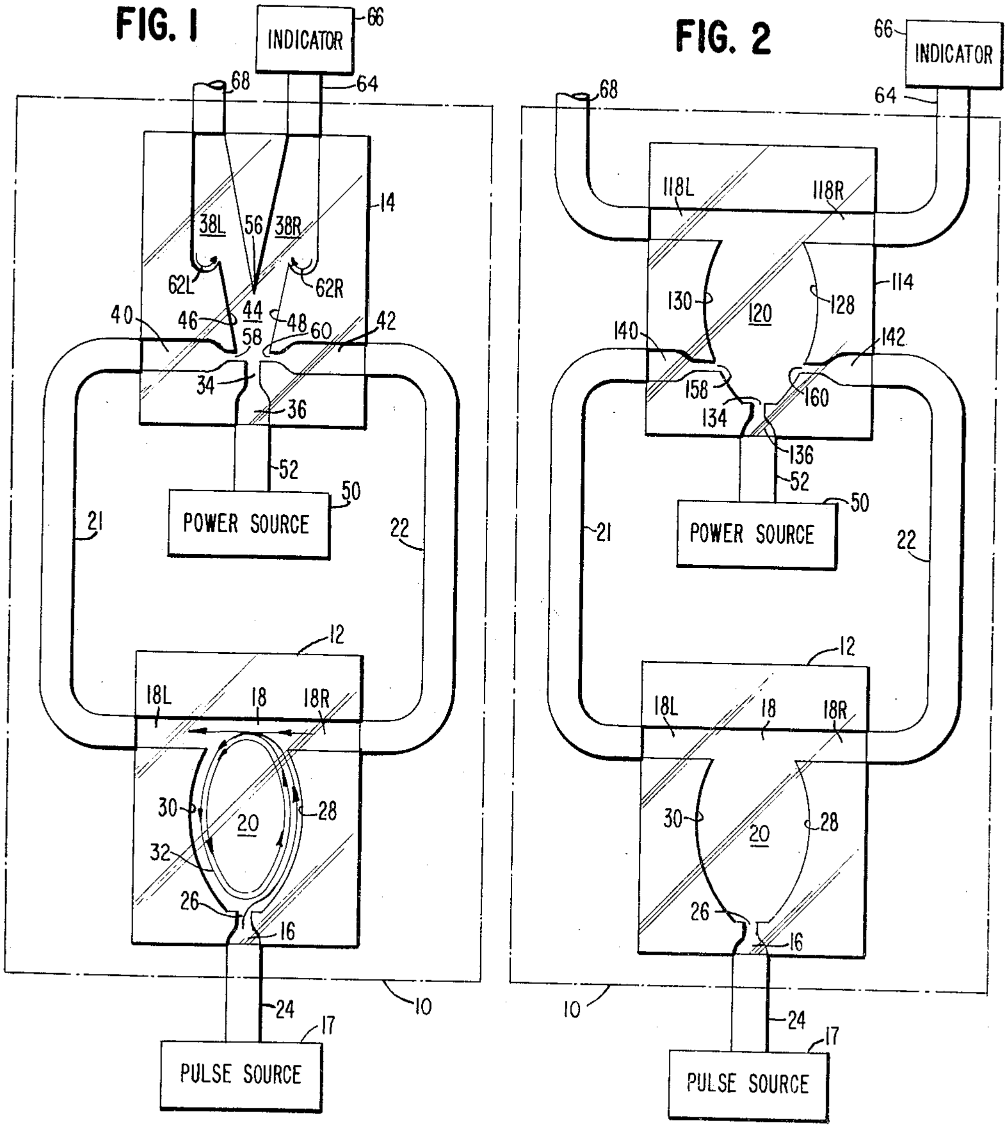

The present invention relates to binary counter stages operating on pure fluid principles. More particularly, this invention relates to binary counter stages of the type having two bistable pure fluid amplifiers interconnected such that each pulse received by a first amplifier causes the second amplifier to change from one stable state to the other. Counter stages constructed in accordance with the principles of the present invention are characterized by the fact that the first amplifier is a vortex amplifier having its output channel connected in a feedback loop between the control signal input orifices of the second amplifier whereby fluid flow between said orifices determines the path of flow of a fluid pulse applied to the first amplifier.

Pure fluid counters of the type heretofore known have employed two pure fluid amplifiers in each stage, these amplifiers exhibiting bistable characteristics and being of the type disclosed on page 15 of the April 1960 issue of the publication Automatic Control. In these counters the output channels of the first amplifier are connected to the control signal input channels of the second amplifier in such manner that a fluid pulse applied to the first amplifier is caused to flow into one or the other output channel of the first amplifier depending upon the state of the second amplifier. However, counter stages employing as the first amplifier an amplifier of the type disclosed in the aforementioned publication are unreliable and tend to oscillate even though no input pulses are being applied.

In copending application Serial No. 135,824, filed September 5, 1961, I disclose a pure fluid amplifier wherein a bistable characteristic is attained by causing the power stream to flow in a vortex in the interaction chamber. For the purposes of the following description and claims, the term "vortex amplifier" means an amplifier of the type described in that application. A binary counter stage employing a vortex amplifier is more reliable than counter stages of the prior art and does not tend to enter a state of oscillation.

Accordingly, a primary object of this invention is to provide reliable binary counter stages employing two fluid amplifiers in each stage.

An object of the present invention is to provide a modulo-2 binary counter having a first fluid amplifier of the vortex type and a second fluid amplifier having its control signal channels connected to the output channels of the first amplifier. As the power stream flows through the second amplifier it creates different pressures at the orifices of the control signal channels terminating on each side of its path of flow. One control signal channel on one side of the path of flow is interconnected through a feedback path with a control signal channel on the opposite side of the path of flow so that fluid flows through the feedback path because of the difference in pressures at the control signal orifices. The output channel of the first amplifier is connected in series with the feedback path so that a portion of the feedback signal enters the vortex chamber of the first amplifier and creates a vortex which flows across the orifice where the power stream enters the vortex chamber of the first amplifier. The direction of flow of the feedback signal determines the direction of vortex flow and this in turn determines the direction in which the power stream enters the output channel of the first amplifier.

An object of the present invention is to provide a modulo-2 counter as described above wherein both the first and second amplifiers are pure fluid amplifiers of the vortex type.

An object of the present invention is to provide a modulo-2 counter as described above wherein the first amplifier is a pure fluid amplifier of the vortex type and the second amplifier is a pure fluid amplifier of a different type.

Other objects of the invention and its mode of operation will become apparent upon consideration of the following description and the accompanying drawing in which:

FIGURE 1 shows a modulo-2 counter employing a vortex amplifier and an amplifier of the boundary layer control type; and FIGURE 2 shows a modulo-2 counter employing two vortex amplifiers.

The pure fluid amplifiers subsequently described may employ air or another gas or water or another liquid as the working fluid. If desired, solid particles may be entrained in the working fluid. The amplifiers may be constructed of plastic, metallic, ceramic or other material. For ease of illustration they are shown in the accompanying drawing as being made of a clear plastic material.

The amplifiers may comprise three flat plates. The desired channel configuration is cut, etched, stamped or otherwise formed in one of the plates. This plate is then covered on each side with the other two plates and the plates screwed or otherwise bonded together to form a substantially solid body. The body is then bored and tapped so that pipes may be attached to apply signals to and convey signals from the amplifier. This construction is well known in the art hence the accompanying drawings show only the channel configurations which define the paths of fluid flow. It should be understood that the term channel as used herein refers to pipes, tubes, closed ducts or other closed passageways for conveying fluid.

Referring now to FIGURE 1, the modulo-2 counter 10 includes a first pure fluid amplifier 12 of the vortex flow type and a second pure fluid amplifier 14 of the boundary layer control type.

Vortex flow amplifier 12 has a power stream input channel 16, an output channel 18, and a vortex flow inducing chamber 20 connecting the input channel to the output channel in a region intermediate its ends thus forming output channel legs 18L and 18R. Fluid control signals are applied to legs 18L and 18R to control the amplifier in a manner subsequently described. Output signals from the amplifier pass through legs 18L and 18R and are applied to amplifier 14 over fluid conveying means such as channels 21 and 22.

Pulse source 17 designates any conventional means for producing a sequence of fluid pulses to be counted. Source 17 may, for example, comprise another binary counter stage similar to binary counter stage 10. Fluid pulses from source 17 are conveyed by a channel 24 to the power stream input channel 16 from when they pass through an orifice and enter the vortex chamber 20.

Chamber 20 has an oval shape as defined by walls 28 and 30 and has a longitudinal axis substantially perpendicular to the longitudinal axis of output channel 18.

As explained in my aforementioned copending application if perfect symmetry is attained a power stream issuing from orifice 26 passes straight through chamber 20, strikes the side of channel 18, and divides equally so that half flows into leg 18L and half flows into leg 18R. However, any imbalance of forces on the power stream as it emerges from orifice 26 causes the power stream to move to the left or right so that it flows along one of the walls 28 or 30.

In FIGURE 1 the imbalance of forces on the power stream created when fluid flows through the output channel 18 is utilized to control the direction in which the power stream flows into the output channel. Assume for example that fluid from channel 22 is flowing through legs 18R and 18L to channel 21. A portion of this fluid enters chamber 20 and because of the shape of chamber 20 the fluid flows down wall 30, across orifice 26 and up wall 28 thus creating a vortex wherein fluid flows in a counterclockwise direction as indicated by vector 32. If a power stream begins to issue from orifice 26 at this time it is deflected toward wall 28 by the vortex flow which is from left to right across orifice 26. The power stream flows up wall 28 and because of the curvature of wall 28 most of the power stream flows into leg 18L of the output channel. Vector 34 indicates the general path of flow of the power stream at this time.

All of the power stream does not enter the output channel. Because of the chamber configuration a portion of the power stream flows downwardly along wall 30 from the region of the output channel, then flows across orifice 26 and up wall 28 thus creating a vortex flow in the same direction as the vortex created by the control signal. Since this vortex flow is from left to right across orifice 26 and the power stream continually feeds fluid to the vortex, the vortex will continue to deflect the power stream so that it flows along wall 28 and into leg 18L as long as the power stream is maintained. This state of fluid flow represents one stable state of the vortex amplifier 12 and once established it is not changed by pressure changes in channels 21 and 22.

As described above, fluid flow from channel 22 to channel 21 sets up a counterclockwise vortex flow in chamber 20. On the other hand, fluid flow from channel 21 to channel 22 creates a clockwise vortex flow in chamber 20. A portion of the fluid moving from leg 18L toward leg 18R splits off and enters chamber 20. It flows down wall 28, across orifice 26 and up wall 30. A pulse applied to channel 16 at this time causes a power stream to begin flowing from orifice 26. The force applied to the power stream by the clockwise vortex flow deflects the power stream toward wall 30 and it flows upward along this wall and into leg 18R of the output channel.

Again, all of the power stream does not flow into the output channel. Because of the chamber configuration a portion of the power stream splits off, flows down wall 28, across orifice 26 and up wall 30 thus causing the power stream to be deflected toward wall 30. Therefore, as long as the power stream continues to flow a portion of it creates a vortex flow to hold the power stream against wall 30 so that it flows into leg 18R of the output channel. This state of fluid flow represents a second stable state of amplifier 12 and once established it is not changed by pressure changes in channels 21 and 22.

Pure fluid amplifier 14 is a conventional fluid amplifier of the boundary layer control type. It comprises a power stream input channel 36, first and second output channels 38L and 38R and first and second control signal input channels 40 and 42. An interaction chamber 44 bounded by walls 46 and 48 is formed where the power stream input channel intersects the output channels.

Power source 50 represents means for supplying a constant source of fluid. It may be a pump or compressor of conventional design and preferably includes pressure regulating means to thereby provide a substantially constant flow of fluid. A channel 52 connects source 50 to the power stream input channel 36.

The power stream passing through channel 36 emerges from orifice 54 as a high velocity jet stream and, assuming perfect symmetry, flows through chamber 44 to strike dividing element 56 and flow equally into output channels 38L and 38R. However, the chamber is purposely made asymmetrical by offestting walls 46 and 48 from orifice 34 by unequal distances or by offsetting dividing element 56 so that the opening into one output channel is greater than the opening into the other output channel in the region where they meet to form the interaction chamber. Other means of attaining asymmetry are possible and the methods mentioned are by way of illustration only.

By way of illustration assume that orifice 34 is closer to wall 46 than it is to wall 48. According to Bernoulli's theorem a high velocity fluid jet stream passing through an orifice into an enlarged chamber tends to entrain molecules of fluid from the region through which the jet flows thus reducing the pressure in the chamber. In amplifier 14 when the power stream is applied to channel 36 it emerges from orifice 34 and enters chamber 44 as a high velocity jet stream thus tending to withdraw molecules from the regions between the jet and walls 46 and 48. Since orifice 34 is closer to wall 46 than it is to wall 48 the jet issuing therefrom withdraws more molecules from the region adjacent wall 46 than it does from the region adjacent wall 48. This causes a greater decrease in pressure in the region adjacent wall 46 than in the region adjacent wall 48. The resulting difference in pressures tends to push the power jet stream closer to wall 46. The closer the jet moves to wall 46 the more efficient it becomes in withdrawing fluid from the region adjacent the wall and lowering the pressure. The effect is cumulative and eventually the power jet "locks on" to wall 46. That is, the power jet emerging from the orifice 34 flows along wall 46 and into output channel 38L. This is referred to as the reset state of the amplifier.

There exists between the jet stream and wall 46 a boundary layer or low pressure region of relatively slow moving fluid hence the amplifier is referred to as being of the boundary layer control type.

Amplifier 14 remains in the reset state described above as long as the power stream is applied to input channel 36 and no signal is applied to control signal input channel 40. By applying a control signal to channel 40 the amplifier may be switched to the set state with the power jet flowing along wall 48 into channel 38R. The switching operation may be explained as follows.

When a fluid control signal is applied to control signal input channel 40 it causes fluid to emerge from orifice 58 and enter chamber 44. This fluid flows into the low pressure boundary layer region between the power stream and wall 46. As more fluid flows into this region the pressure builds up and the power stream begins to swing away from wall 46 and toward wall 48. The closer the power stream moves toward wall 48 the more efficient it becomes in withdrawing molecules from the region adjacent the wall and thus reducing the pressure in this region. Again, the action is cumulative and the power stream locks on to wall 48 and flows into output channel 38R. This is referred to as the set state of the amplifier. It should be noted that this is a stable state. That is, the action of the power stream in creating a low pressure region adjacent wall 48 causes the power stream to remain locked on to the wall even after fluid stops flowing into chamber 44 through orifice 58.

The amplifier may be reset by applying a fluid signal to control signal channel 42. This causes fluid to emerge from orifice 60 thus increasing the pressure between the power stream and wall 48. As the pressure increases the power stream moves closer to wall 46 decreasing the pressure thereat until the power stream is again locked on to wall 46.

Output channels 38L and 38R are preferably provided with acute changes of slope to thereby induce fluid flow as indicated by arrows 62L and 62R when the power stream is flowing therethrough. This prevents the amplifier from changing state when heavily back loaded. This method of insuring stable operation of boundary layer type amplifiers is well known. The present invention is not limted to amplifiers having acute slopes in the output channels.

since other means for insuring stable operation are known in the art and are equally suitable for use in practicing the invention.

A tube or fluid conveying means 64 connects output channel 38R to an indicator 66. The indicator may be of known design and arranged to indicate when amplifier 14 is in the set state.

Fluid conveying means 68 may be provided for conveying fluid when the amplifier is reset. When a plurality of counter stages 10 are interconnected to form a multistage binary counter the conveying means 68 of each stage is connected to the power stream input channel 16 of the vortex amplifier in the next higher order stage.

A complete cycle of operation of counter stage 10 will now be described. Initially power source 50 is supplying a power stream which flows through orifice 34, along wall 46 and into output channel 38L. Pulse source 17 has not yet produced the first pulse so there is no power stream issuing from orifice 16.

Because the power stream of amplifier 14 is flowing adjacent wall 46 the pressure at orifice 58 is less than the pressure at orifice 60. A feedback path comprising channels 40, 21, 18, 22 and 42 interconnects the orifices and because of the difference in pressures fluid flows from orifice 60 through the feedback path to orifice 58. The feedback path provides a resistance to fluid flow so that the fluid flowing through the feedback path as a result of the difference in pressures at orifices 58 and 60 is insufficient to switch the power stream of amplifier 14. This resistance may be obtained, for example, by making the orifices and channels of the feedback path quite small.

A portion of the fluid flowing through the feedback path splits off and flows into chamber 20. As explained above this fluid flows down wall 30, across orifice 26 and up wall 28 in a counterclockwise vortex flow. Although this flow is sufficient to determine the direction in which a newly initiated power stream flows in chamber 20, it is insufficient to change the direction of flow once it has started.

When source 17 generates the first pulse a power stream begins to emerge from orifice 26. The flow of feedback fluid across orifice 26 from left to right causes the newly initiated power stream to flow along wall 28 and into leg 18L. The power stream forces sufficient fluid through channel 21, channel 40 and orifice 58 to increase the pressure in the boundary layer region adjacent wall 46 and switch amplifier 14 to its set state.

A portion of the power stream of amplifier 12 splits off to create a counterclockwise vortex flow in chamber 20 which holds the power stream against wall 28 as long as the power stream flows as a result of the pulse from source 17.

When amplifier 14 is switched to the set state its power stream flows along wall 48 hence the pressure at orifice 60 is less than the pressure at orifice 58 due to the boundary layer at wall 48. This may or may not initiate fluid flow from orifice 58 through the feedback path to orifice 60.

If the power stream of amplifier 12 is still flowing as a result of the first fluid pulse the force of the power stream continues to force fluid through channel 21 toward orifice 58. This flow serves no useful purpose once amplifier 14 has been set. When the first pulse terminates and the power stream of amplifier 12 ceases to flow through orifice 26 the pressure differential at orifices 58 and 60 causes fluid to flow from orifice 58 toward orifice 60 through the feedback path.

Again, a portion of the fluid flowing in the feedback path enters chamber 20. This time it flows down wall 28, across orifice 26 and up wall 30 in a clockwise vortex flow. Once flow across orifice 26 is established the counter is ready to receive the second fluid input pulse.

When source 17 produces the second fluid pulse the power stream of amplifier 12 again begins to emerge from orifice 26. The existing vortex flow in a clockwise direction now deflects the power stream so that it flows up wall 30 and through leg 18R, channels 22 and 42 to orifice 60. This causes sufficient fluid to issue from orifice 60 to build up the pressure in the region adjacent wall 48 and switch amplifier 14 to its reset state.

A portion of the power stream flowing up wall 30 flows down wall 28 to maintain a clockwise vortex flow which holds the power stream against wall 30 as long as fluid emerges from orifice 26. When the power stream stops flowing through orifice 26 because the second pulse is terminated by source 17 the pressure differential between orifices 58 and 60 again causes fluid to flow from orifice 60 to orifice 58 through the feedback path.

The conditions of the counter stage are the same now as before the first pulse from source 17 was applied. Thus, the counter stage produces one fluid pulse in output channel 38R for every two pulses applied to channel 24. Every other pulse applied to channel 24 sets amplifier 14 and each alternate pulse resets it.

As previously stated the present invention is characterized by the fact that the input amplifier of the counter stage is a vortex amplifier. The second amplifier may be any conventional bistable fluid amplifier and the stated advantages over prior pure fluid counters still result if the imput amplifier is of the vortex type.

FIGURE 2 shows the channel configuration for a binary counter stage wherein a vortex amplifier 114 is substituted for the boundary layer controlled amplifier 14 shown in FIGURE 1. Otherwise, the counter of FIGURE 2 is similar to the counter of FIGURE 1 and like elements bear the same reference numeral.

Vortex amplifier 114 is similar to amplifier 12 previously described. However, amplifier 114 does not receive control signals through its output channel. Instead, amplifier 114 is provided with a pair of control signal input channels 140 and 142 for selectively deflecting a power stream emerging from orifice 134 toward wall 128 or 130.

Power source 50 continuously applies a stream of fluid to power stream input channel 136 thus causing a power jet to emerge from orifice 134. Assume that due to certain inherent asymmetries there is an unbalanced force which deflects the power stream toward wall 128. The power stream flows along wall 128 and into leg 118L of the output channel.

All of the power stream does not flow into leg 118L. A portion of the power stream splits off, flows down wall 130, across orifice 134 and up wall 128 in a counterclockwise vortex flow. This vortex tends to deflect the power stream toward wall 128 so that the power stream maintains this stable state of flow until a further force acts on it. The amplifier is considered to be in the reset state when its power stream is flowing along wall 128 and into leg 118L.

The amplifier may be switched from the reset state to the set state by applying a fluid signal to channel 142. This causes a jet to issue from orifice 160 which strikes the power stream flowing across the orifice. As explained in my aforementioned application, the force exerted on the power stream by a small jet is sufficient to deflect the power stream from its stable state of flow. Thus, when the jet issuing from orifice 168 strikes the power stream it is deflected so that it flows close to wall 130. The power stream flows up wall 130 and into leg 118R of the output channel. This is considered to be the set state of the amplifier.

The set state of the amplifier is a stable state which is maintained even after the control jet ceases to flow. A portion of the power stream flowing up wall 130 does not enter leg 118R but splits off and flows down wall 128 and across orifice 134 in a clockwise vortex flow in the chamber 120. The force exerted on the power stream by this vortex flow pushes the power stream toward wall 130 with the power stream continuously feeding more fluid into the vortex from the region where the chamber opens into the output channel.

Control signal input channel 140 is provided for resetting the amplifier. Fluid applied to channel 140 emerges from orifice 158 as a jet. The power stream flowing up wall 130 is deflected by the jet so that it begins to flow up wall 128 and into leg 118L of the output channel. As explained above, this is a stable state of flow since a portion of the power stream creates and maintains a counterclockwise vortex flow. This vortex in turn exerts a force on the power stream so that it continues to flow up wall 128 after the jet ceases to flow from orifice 158.

Counter stage 110 functions in a manner similar to counter stage 10. That is, when the amplifier 114 is reset the power stream flows along wall 128 thus creating at orifice 160 a pressure somewhat less than the pressure at orifice 158. The pressure differential causes fluid to flow from orifice 158 to orifice 160 through the feedback path which includes channels 21, 18 and 22. As with the first embodiment this flow is limited so that the fluid flowing out orifice 160 as a result of the pressure differential is insufficient to switch amplifier 114. A portion of the fluid flowing in the feedback path enters chamber 20 to set up a clockwise vortex flow across orifice 26. If a power stream is initiated in amplifier 12 at this time as a result of a pulse from source 17 it is deflected toward wall 30, flows along this wall and enters leg 18R of the amplifier. This causes sufficient fluid flow in channels 22 and 142 to produce a jet at orifice 160 which deflects the power stream of amplifier 114 into the path of flow representing the set state.

With amplifier 114 set the power stream flows along wall 130 thus creating at orifice 158 a pressure somewhat less than the pressure at orifice 160. This pressure differential causes fluid to flow through the feedback path from orifice 160 to orifice 158. A portion of the fluid flowing through the feedback path enters chamber 20 to create a counterclockwise vortex flow. A power stream initiated in amplifier 12 at this time as a result of a fluid pulse from source 17 is deflected by the vortex flow so that it flows along wall 28 and into leg 18L. This flow creates a jet at orifice 158 which deflects the power stream of amplifier 114 so that it assumes the path of flow representing the reset state. That is, the power stream is deflected so that it flows along wall 128 and into leg 118L of the output channel.

It is seen therefore that counter stage 110 functions in the same manner as counter stage 10. Alternate pulses applied to the power stream input of amplifier 12 switch amplifier 114 from the reset to the set state with the remaining pulses switching amplifier 114 from the set to the reset state.

An indicator 66 responsive to fluid flow in leg 118R may indicate the state of the counter stage. Fluid flow through leg 118L may be used to perform a work function such as providing fluid pulses to the power stream input channel 16 of the amplifier 12 in another counter stage.

Thus far no mention has been made for controlling the resetting of counter stages. This is desirable so that the counter may be reset to represent a zero value before it starts counting input pulses. The resetting may, for example, be accomplished by providing another control signal input channel for the second amplifier of the counter stage, this control signal input channel being connected to a source of reset signals. In counter stage 10 the amplifier 14 may be provided with an additional or reset control signal input channel located on the same side of the power stream as channel 42. In counter stage 110 the amplifier 114 may be provided with a reset control signal input channel located on the same side of the power stream as channel 140. The particular reset means employed is by way of illustration only and forms no part of the present invention.

While various preferred embodiments have been shown and described it will be obvious to those skilled in the art that various modifications may be made therein without departing from the spirit and scope of the invention. It is intended therefore to be limited only by the scope of the appended claims.

I claim:

1. The combination comprising: a bistable pure fluid amplifier having first and second opposed orifices through which control streams may flow; means for producing a power stream between said orifices, one stable state of said amplifier being manifested by flow of said power stream nearer to said first orifice and the other stable state of said amplifier being manifested by flow of said power stream nearer to said second orifice; fluid conveying means for conveying fluid from said first to said second orifice when said amplifier is in said other stable state and from said second to said first orifice when said amplifier is in said one state; a bistable vortex amplifier having a chamber for creating vortex flow, said vortex amplifier having an output channel connected to said vortex chamber and forming a part of said fluid conveying means whereby a portion of the fluid being conveyed between said orifices enters said vortex chamber to create a control vortex flow therein; and means for intermittently introducing fluid pulses into said vortex chamber.

2. The combination as claimed in claim 1 wherein said vortex chamber has a wall configuration for creating a vortex flow in one direction when said bistable pure fluid amplifier is in said one state to direct said fluid pulses into the output channel of said vortex amplifier in one direction and a vortex flow in the opposite direction when said bistable pure fluid amplifier is in said other state to direct said fluid pulses into the output channel of said vortex amplifier in the opposite direction.

3. The combination as claimed in claim 2 wherein said fluid conveying means includes means for limiting the magnitude of said control vortex flow to a magnitude sufficient to influence the direction of flow of said fluid pulses as they are initiated in said vortex chamber, said magnitude being insufficient to change the direction of fluid pulse flow once pulse flow has been established in said chamber.

4. The combination as claimed in claim 3 wherein said pure fluid amplifier is a boundary layer controlled amplifier having first and second output channels which converge at an acute angle at their upstream extent to form an interaction chamber, said first and second orifices being located in the walls of said chamber.

5. The combination comprising: a bistable pure fluid amplifier having a central chamber; means for introducing a power stream into said chamber, output means for receiving said power stream, and first and second control signal input channels terminating at orifices in opposed walls of said central chamber, a first stable state of said amplifier being defined by flow of said power stream adjacent said first orifice and the second stable state of said amplifier being defined by flow of said power stream adjacent said second orifice; fluid conveying means connected to said first and second control signal channels and responsive to the difference in pressures at the orifices thereof for creating a vortex flow in a first or a second direction; means for producing intermittent fluid signals in the region of said vortex flow, said vortex flow directing said fluid signals into said fluid conveying means to flow toward said first orifice when said bistable amplifier is in said first state and directing said fluid signals into said fluid conveying means to flow toward said second orifice when said bistable amplifier is in said second state.

6. The combination as claimed in claim 5 wherein said pure fluid amplifier is a boundary layer controlled amplifier and said output means comprises first and second output channels which converge at an acute angle at their upstream extent to form said central chamber.

7. The combination as claimed in claim 5 wherein said pure fluid amplifier is a vortex amplifier.

8. A binary counter comprising: a bistable pure fluid amplifier having a chamber and means for injecting a power stream into said chamber, first and second channels for injecting fluid into said chamber to control the direction of flow of said power stream; means interconnecting said first and second channels for conveying fluid from one of said channels to the other without passing through said chamber; a vortex amplifier having a chamber shaped to induce a vortex flow therein, said chamber being connected to said interconnecting means whereby fluid flowing from one of said first and second channels to the other creates a control vortex flow in said vortex chamber, fluid flow from said first to said second channel inducing a control vortex in a first direction which directs the power stream of said vortex amplifier into said interconnecting means and toward said second channel and fluid flow from said second to said first channel inducing a control vortex in a second direction which directs the power stream of said vortex amplifier into said interconnecting means and toward said first channel, said control vortex flow being restricted by said interconnecting means to a magnitude insufficient to change the direction of power stream flow through said vortex chamber once power stream flow has become established therein; and means for intermittently injecting a power stream into said vortex chamber, said control vortex being of sufficient magnitude to influence the direction of power stream flow in said vortex chamber at the instant said power stream is initiated.

References Cited by the Examiner

UNITED STATES PATENTS 3,024,805 3/62 Horton.

FOREIGN PATENTS 1,278,781 11/61 France.

LAVERNE D. GEIGER, *Primary Examiner.*

WILLIAM F. O'DEA, *Examiner.*